(12) United States Patent
Gollapudi et al.

(10) Patent No.: US 10,243,511 B1
(45) Date of Patent: Mar. 26, 2019

(54) AUTOMATIC MODULARITY CONTROL FOR MULTI POWER STACK AIR COOLED INVERTER

(71) Applicant: GE Energy Power Conversion Technology Limited, Rugby (GB)

(72) Inventors: Datatreya Reddy Gollapudi, Chennai (IN); Britto Arputhanathan, Chennai (IN); Venkateswaran Mathurai, Chennai (IN)

(73) Assignee: GE ENERGY POWER CONVERSION TECHNOLOGY LIMITED, Rugby (GB)

( * ) Notice: Subject to any disclaimer, the term of this patent is extended or adjusted under 35 U.S.C. 154(b) by 0 days.

(21) Appl. No.: 16/007,721

(22) Filed: Jun. 13, 2018

(51) Int. Cl.
| | |
|---|---|
| *H02S 40/32* | (2014.01) |
| *H02M 7/00* | (2006.01) |
| *H02M 7/5387* | (2007.01) |
| *H02H 7/122* | (2006.01) |
| *H02S 40/34* | (2014.01) |
| *H01L 31/02* | (2006.01) |

(Continued)

(52) U.S. Cl.
CPC ........ *H02S 40/32* (2014.12); *H01L 31/02021* (2013.01); *H02H 7/1225* (2013.01); *H02M 7/003* (2013.01); *H02M 7/5387* (2013.01); *H02S 40/345* (2014.12); *H05K 7/209* (2013.01); *G05F 1/67* (2013.01)

(58) Field of Classification Search
CPC .. H02M 7/5387; H02M 7/003; H02H 7/1225; G05F 1/67
See application file for complete search history.

(56) References Cited

U.S. PATENT DOCUMENTS

| 6,285,572 B1 | 9/2001 | Onizuka et al. |
| 8,922,059 B2 | 12/2014 | Yoneda et al. |

(Continued)

OTHER PUBLICATIONS

Eaton, "Utility-Scale Photovoltaic Inverter Installation and Operation User Manual for Power Xpert Solar 1500/1670 kW Inverter", Oct. 2014. 90 pages.

(Continued)

*Primary Examiner* — Adolf D Berhane
*Assistant Examiner* — Afework S Demisse
(74) *Attorney, Agent, or Firm* — GE Global Patent Operation; Scott R. Stanley

(57) ABSTRACT

Provided is a method for performing automatic modularity control of an inverter and an inverter that includes DC power sources configured to supply DC power, a plurality of converters to convert direct current power to alternating current power to be supplied to a load, and a controller. The controller performs automatic modularity control of the plurality of converters, by separately controlling the plurality of converters and detecting an operation status thereof and performs fault detection at the plurality of converters at an early stage and isolates a respective converter of the plurality of converters, while continuously supplying power to the load via remaining converters of the plurality of converters. The automatic modularity control further includes early fault detection based continuous monitoring of the current produced by each converter and semiconductor switching feedback and cyclic starting of the inverter to normalize the lifecycle of the circuit breaker.

30 Claims, 5 Drawing Sheets

(51) Int. Cl.
*H05K 7/20* (2006.01)
*G05F 1/67* (2006.01)

(56) References Cited

U.S. PATENT DOCUMENTS

2005/0105224 A1   5/2005  Nishi
2014/0192570 A1*  7/2014  Nielsen .................. H02J 1/102
                                                    363/50

OTHER PUBLICATIONS

Kaeser Compressors "Centrifugal separators" 3 pages from website http://www.kaeser.com/int-en/products/air-treatment-and-condensate-technology/centrifugal-separators/.
SMA, "Central Invert Operating and Maintenance Manual" Document No. MVPP_OCD-WH-US_en-10 | 98-4032310 | Version 1.0. US, 168 pages.
OPTI-Solar, " Solar Hybrid Inverter SP Power Series", Users Manual, Version 1.1, 44 pages.
SMA Solar Academy, "Inverter in large scale PV plants" SMA Solar Technology AG, Document No. P-P-INV-1_DE-en_WW-123610, 129 pages.
Solectria Renewables, "Installation and Operation Manual, Commercial, Grid-Tied Photovotaic Inverters", 2010 DOC-020099 rev 041, 42 pages.
SGW Werder GMBH & Co. KG, "Centrifugal Force Sediment Separator (FSA)", Product Sheet. 8 pages.
Parker, "890GT-S Series Outdoor Central Solar Inverter", Document No. HA473461 RevMay 13, 2017, 12 pages.

* cited by examiner

AUTOMATIC MODULARITY CONTROL FOR MULTI POWER STACK AIR COOLED INVERTER

I. TECHNICAL FIELD

The present invention relates generally to controlling a multi power stack inverter. In particular, the present invention relates to control of a multi power stack air cooled inverter (e.g., a solar inverter).

II. BACKGROUND

Traditional multi-stack solar inverters are employed to supply convert direct current (DC) power into alternating current (AC) power to be supplied for commercial and residential use. The DC power source can be a solar battery (e.g., a plurality of solar cell arrays). The multi-stack includes a plurality of power stacks (e.g., power converters) as a single unit and operate together to generate the AC power to be supplied. The conventional solar inverter, however, does not allow the operation of inverter incase if there is any fault in a particular power stack even though the other power stacks are healthy with which we could produce partial power. The conventional inverter also does not have the capability for intentional or planned isolation of a single or set of power stacks while simultaneously supplying power with the remaining power stacks. Further, fault detection within a particular power stack may not be detected early enough to prevent overall damage to the solar inverter.

As a result of this delayed fault detection, further system delay and malfunction can occur, requiring excessive maintenance to replace any faulty components. Also, the conventional inverter does not normalize the number of operations of the circuit breakers, this may result in poor reliability of the overall system.

III. SUMMARY OF THE EMBODIMENTS

Given the aforementioned deficiencies, needed is a system and method for automatic modularity control of power stack (i.e., power converters) within an inverter (e.g., a solar inverter) to monitor the status of the power stack and continuously supply power to the end user as necessary without delay. In addition, methods and systems are needed to extend the life cycle of the individual power stacks and associated components by performing cyclic start sequencing to maintain the health of the overall inverter thereby improving the reliability of the inverter.

According to one embodiment, an inverter is provided. The inverter includes a plurality of DC power sources configured to supply DC power, a plurality of converters to convert direct current power to alternating current power to be supplied to a load, and a controller. The controller performs automatic modularity control of the plurality of converters, by separately controlling the plurality of converters and detecting an operation status thereof and performs fault detection at the plurality of converters and isolates a respective converter of the plurality of converters, while continuously supplying power to the load via remaining converters of the plurality of converters.

The foregoing has broadly outlined some of the aspects and features of various embodiments, which should be construed to be merely illustrative of various potential applications of the disclosure. Other beneficial results can be obtained by applying the disclosed information in a different manner or by combining various aspects of the disclosed embodiments. Accordingly, other aspects and a more comprehensive understanding may be obtained by referring to the detailed description of the exemplary embodiments taken in conjunction with the accompanying drawings, in addition to the scope defined by the claims.

IV. DESCRIPTION OF THE DRAWINGS

The drawings are only for purposes of illustrating preferred embodiments and are not to be construed as limiting the disclosure. Given the following enabling description of the drawings, the novel aspects of the present disclosure should become evident to a person of ordinary skill in the art. This detailed description uses numerical and letter designations to refer to features in the drawings. Like or similar designations in the drawings and description have been used to refer to like or similar parts of embodiments of the invention.

V. DETAILED DESCRIPTION OF THE EMBODIMENTS

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns. The figures are not necessarily to scale and some features may be exaggerated or minimized to show details of particular components.

In other instances, well-known components, apparatuses, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

As noted above, the embodiments provide a system and method for automatic modularity control of multi-stack converters within a solar inverter, for example a 1500V AC Class multi-stack air cooled solar inverter. The present invention is not limited to being employed within a particular inverter and can be varied to be suitable for other applications.

Figure 1:
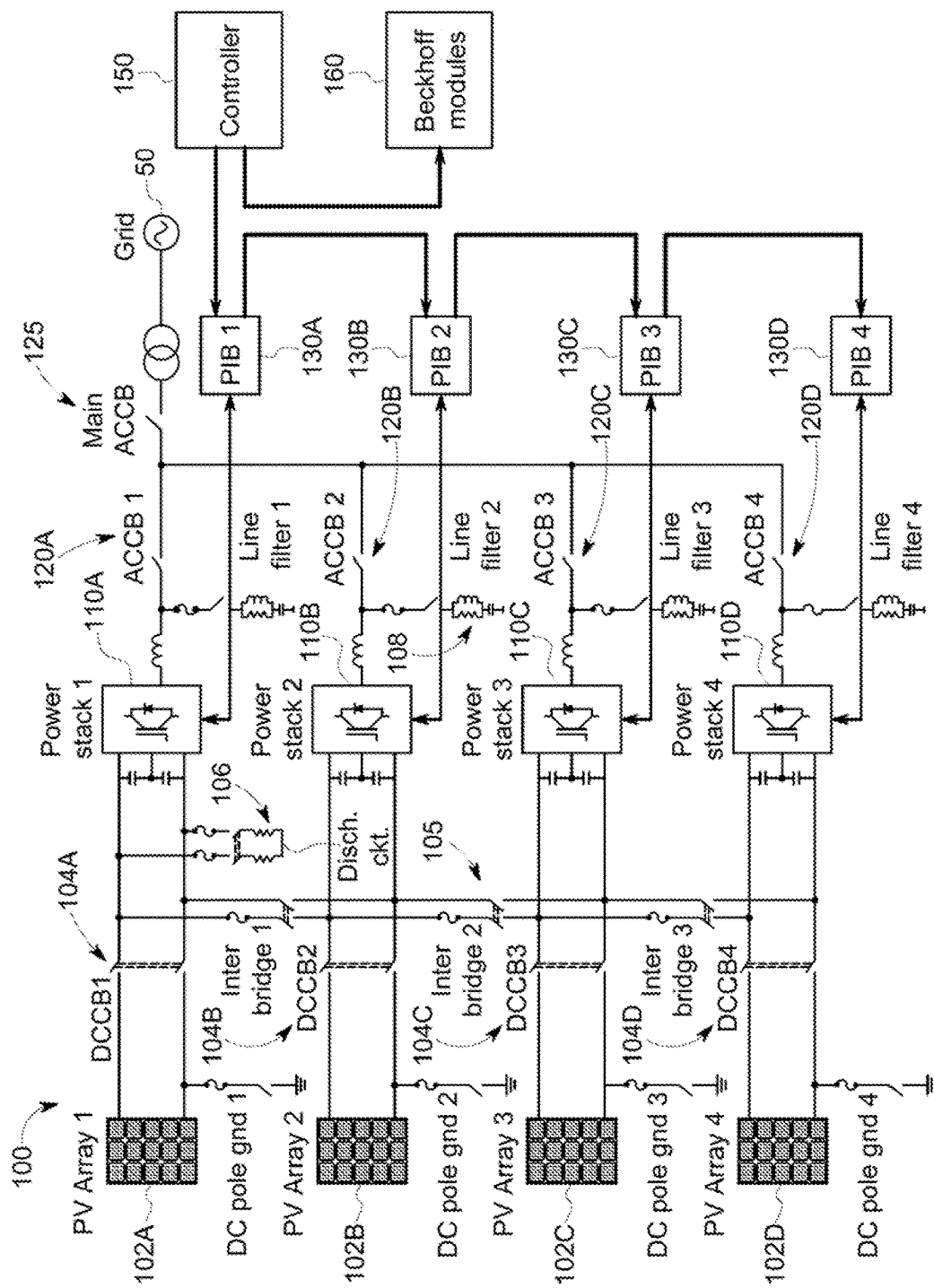
FIG. 1 is a schematic illustrating an inverter (e.g., a solar inverter) including a plurality of converters in accordance with one or more embodiments of the present invention.

FIG. 1 is a schematic illustrating an exemplary solar inverter 100 for supplying AC power to a Grid 50. In the example of FIG. 1, the three phase Grid 50 is fed by the solar inverter with multiple power stacks by converting DC power from photovoltaic (PV) arrays (e.g., a plurality of solar cell arrays) 102A-102D each connected to a ground via a DC pole, and a plurality of inter bridges 105. Also included is a plurality of power stacks 110 (e.g., Power Stack 1, Power Stack 2, Power Stack 3 and Power Stack 4). Each the power stacks 110 is connected to a respective inter bridge 105 and a discharge circuit 106.

Each PV array 102A-102D is a DC power source formed of a solar cell string having a plurality of solar cell modules connected together. Each of the arrays 102A-102D provides an output power comparable to the other PV arrays 102A-102D. In the illustrious example of FIG. 1, each PV array 102A-102D supplies approximately 1500V of DC voltage and sized based on the power capacity of the solar inverter. That is, in the solar inverter 100, it is desirable that the PV arrays 102A-102D supply a similar amount of DC power. The solar inverter 100 is configured to transform the DC power supplied by each PV array 102A-102D into AC power via the plurality of converters 110A-110D.

The solar inverter 100 further includes a plurality of DC circuit breakers 104A-104D, each connected between a respective PV array 102A-102D and an input of a respective converter 110A-110D. Inter bridges 105 and a discharge circuit 106 are connected between the DC circuit breakers 104A-104D and the converters 110A-110D. A plurality of AC circuit breakers 120A-120D are also provided, and each is connected at an output of a respective converter 110A-110D.

In FIG. 1, The DC and AC circuit breakers 104A-104D and 120A-120D and inter bridges 105 serve as isolators. They independently isolate the individual faulty converters 110A-110D and associated components e.g., PV array 102A-102D from the remaining healthy converters 110A-110D when a fault occurs.

In the embodiment of FIG. 1, a line filter 108 is connected between each converter 110A-110D and a respective AC circuit breaker 120A-120B. The line filter 108 is a low pass filter which removes harmonics from the AC current on the line of the respective converter 110A-110D.

Figure 2A:
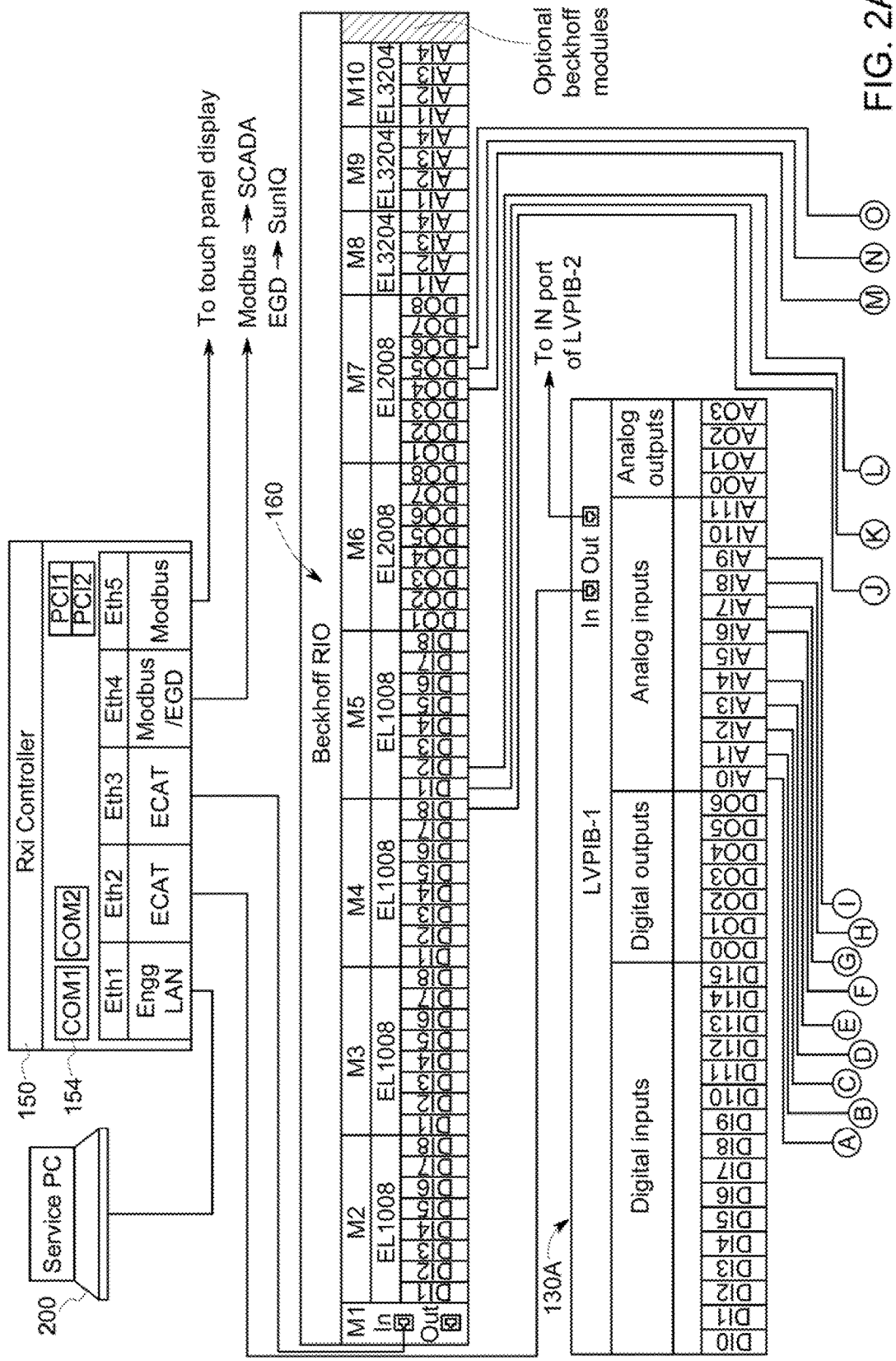
FIGS. 2A and 2B are a schematic illustrating the interface between the controller and a converter of the plurality of converters shown in FIG. 1 that can be implemented within the embodiments.
Figure 2B:
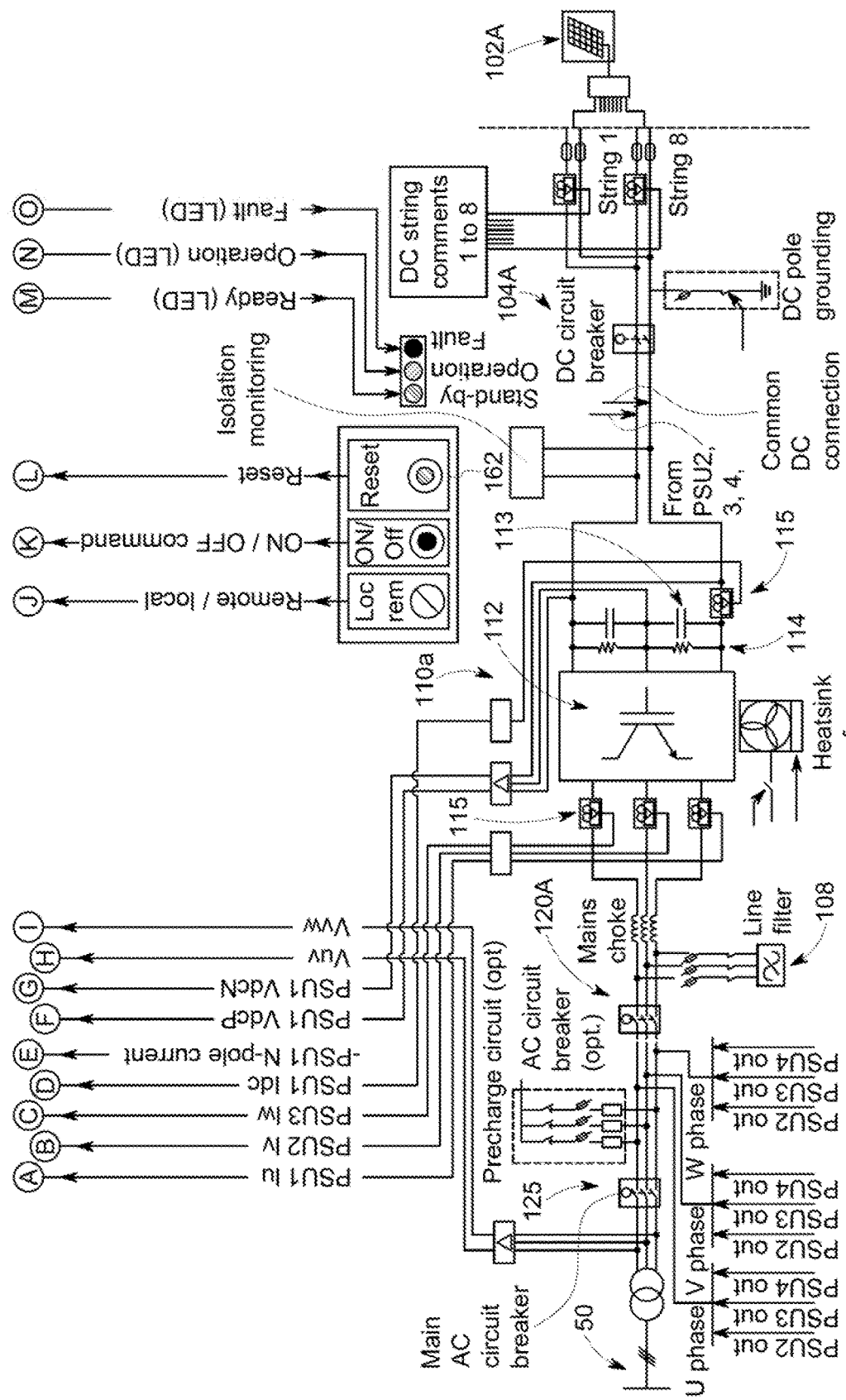

Inverters within the plurality of converters 110A-110D are configured to be substantially identical, including the same components as depicted in FIGS. 2A and 2B. Therefore, a description of the converter 110A is provided for illustration purposes only.

In FIGS. 2A and 2B, and by way of example only and not limitation, the converter 110A includes a semiconductor device (e.g., an insulated-gate bipolar transistor) 112 connected with a plurality of resistors 114 and a plurality of capacitors 113. The plurality of resistors 114 are series connected and the plurality of capacitors 113 are series connected, both being connected in parallel to the semiconductor device 112.

In FIGS. 2A and 2B, the converter 110A also includes a plurality of voltage/current sensors 115 to monitor the voltage/current at the input and output of the convener 110A. According to the embodiments, the converters 110A-110D are DC-to-AC converters although the present invention is not limited hereto. The converters 110A-110D can be any type of converters suitable for the purposes set forth herein.

Referring back to the example of FIG. 1, each AC breaker 120A-120D is connected to a main AC system breaker 125 supplying AC power directly to the load (i.e., the three phase grid 50), when desired.

The solar inverter 100 further includes a plurality of power interface boards (PIBs) 130, each corresponding to a respective converter 110A-110D. The PIBs 130 are connected together to interface between the converters 110A-110D and a controller 150 controlling operation and monitoring the status of each converter 110A-110D. The solar inverter 100 also comprises input/output (I/O) modules 160 (e.g., Beckhoff® modules).

The PIBs 130A-130D are configured to supply control signals from the controller 150 to the respective converter 110A-110D when received. Details regarding the controller 150 and the automatic modularity control operation thereof will be discussed below with reference to FIGS. 2-4.

Figure 3:
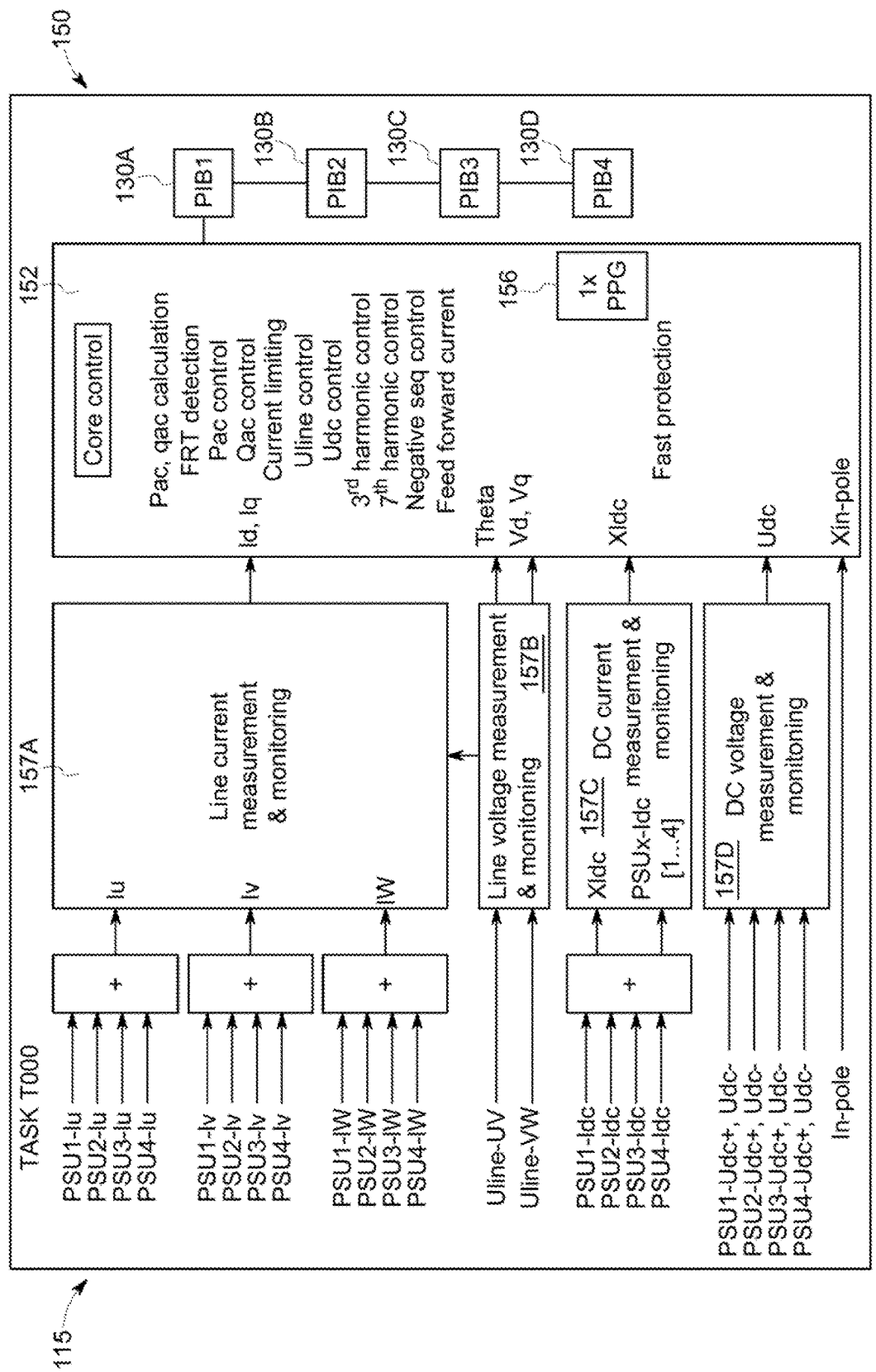
FIG. 3 is a detailed block diagram illustrating the controller within the solar inverter of FIG. 1 that can be implemented within the embodiments.

According to embodiments of the present invention, as shown in FIGS. 2 and 3, the controller 150 is an RXi distributed input/output controller having a dual core central processing unit (CPU) 152 and a plurality of ethernet ports 154 to be connected to the PIBs 130A-130D, the I/O modules 160 and at least one remote computing device (e.g., a service PC) 200.

Core control of the controller 150 has a single max power point (MPPT) tracker. The MPPT tracker along with voltage and current controllers employ a common programmable pulse generator (PPG) 156 for generating pulses to perform an aggregated control operation for controlling the converters 110A-110D. Core control algorithm 152 is configured to perform several calculation and control operations to maintain control of the converters 110A-110D. These operations include, for example, active and reactive power control ($P_{AC}$ $Q_{AC}$) calculations, fault ride-through (FRT) detection, $P_{AC}$ control, $Q_{AC}$ control, current limiting, line voltage control, DC bus (UDC) control, third ($3^{rd}$) harmonic control, seventh ($7^{th}$) harmonic control, negative sequence control, and current control, for example.

In the embodiments, the controller 150 it is not limited to performing a particular number or type of calculation. Control operations and can vary as suitable for the purposes set forth herein. The control modules 157A-157D include a line current measurement and monitoring control module 157A, a line voltage measurement and monitoring control module 157B, a DC current measuring and monitoring control module 157C and a DC voltage measurement and monitoring control module 157D.

By way of example, the control modules 157A-157D are connected with a plurality of current/voltage sensors 115 via PIBs 130A-130D and from there through the ethernet ports 154 using PIBLink communication to provide data to the controller 150 for processing. Fault detection and automatic modularity control of the converters 110A-110D will be discussed now with reference to FIGS. 1 and 4.

In the embodiment of FIG. 1, during normal operation, controller 150 continuously monitors the operation status of the main components of the solar inverter 100 including the PV arrays 102A-102D. The controller 150 also monitors the converters 110A-110D, and the PIBs 130A-130D, in addition to the other components, for fault detection and early stage detection of faulty components of the converters 110A-110D.

If operating properly, the DC breakers 104A-104D are closed and the PV arrays 102A-102D are supplying DC power directly to the converters 110A-110D. The DC power is converted at the converters 110A-110D and the switching harmonics removed via each line filter 108. The AC circuit breakers 120A-120D are closed along with the main AC circuit breaker 125 to allow AC power to be supplied to the load 50 (e.g., a utility grid).

Figure 4:
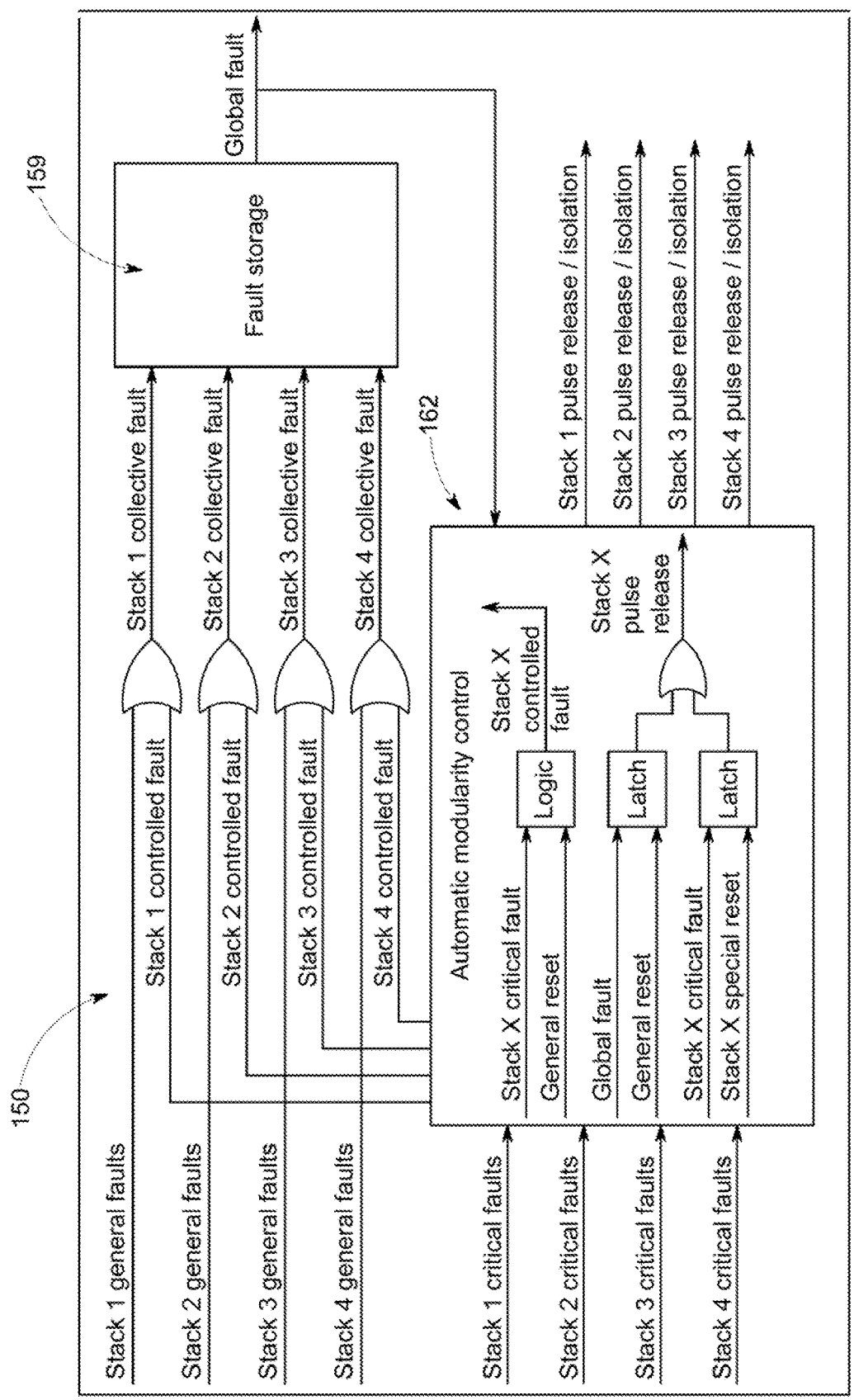
FIG. 4 is a process diagram illustrating exemplary modular fault management of the controller of FIG. 3 that can be implemented within the embodiments.

As shown in FIG. 4, the controller 150 is configured to perform automatic modularity control of the converters 110A-110D by monitoring and tracking faults and storing faults in a fault storage 159 therein. The faults can occur at the individual converters 110A-110D, the PV arrays 102A-102D, and/or the PIBs 130A-130D internally. Faults can also occur in other components (e.g., the DC or AC circuit breakers) in a particular line of a converter or set of converters 110A-110d within the solar inverter 100.

The faults can include general faults which reduce loss of DC power from the PV arrays 102A-102D or faulty circuit breakers. The general faults are non-critical faults and these are reset by the inverter control automatically and restarts the solar inverter with full power, these include communication faults and grid related faults etc. The critical faults generally can't be reset by the inverter control and can reoccur once the inverter started. The modularity control isolates the power stacks or plurality of converters based on the critical faults related to each power stack. The modularity control restarts the inverter with remaining healthy power stacks. The critical faults include IGBT connection faults, firing mismatch faults, PIB faults and line filter faults etc. Automatic modularity control regulates these faults and allows other healthy power stacks to run without any issues. More specific fault examples include controlled faults, collective faults, and critical faults. Based on the types of faults detected (e.g., whether collective, critical, or a global), the controller 150 controls the converters 110A-110D. Control is exercised by release of pulse or isolation to either operate or isolate the respective converter 110A-110D and associated components from the remainder of the converters 110A-110D.

The controller 150 also tracks the number of faults that occurs on each line and the overall life cycle of the converters 110A-110D. The goal of this tracking is to predict when a converter 110A-110D, or other component, may need to be replaced and report recommendations to an end user at the remote computing device 200 (as depicted in FIGS. 2A and 2B). In another embodiment, the controller 150 is capable of emulating the load 50 and simulating the PV arrays 102A-102D, based on data obtained.

According to one embodiment, when a fault is detected as a result of the automatic modularity control of the controller 150, all of the converters 110A-110d are switched off. This process isolates the affected converter 110A-110D and the controller 150 automatically reconfigures the power rating of the solar inverter 100 based on the remaining converters 110A-110D. Afterwards, the solar inverter 100 is restarted with the remaining converters 110A-110D. According to another embodiment, the solar inverter 100 may continue to supply power to the load 50 at a reduced or partial power level with the remaining converters 110A-110D, without switching off and restarting operation thereof. This embodiment improves the availability of the solar inverter and increases the energy produced by the inverter.

As noted, the power produced by the remaining converters 110A-110D may not be at rated power but may still allow the solar inverter 100 to continue operating with delay while the faulty convener 110A-110D is repaired or replaced.

If the controller 150 detects a fault, the controller 150 is configured to segregate and memorize the critical faults as shown in FIG. 3, prior to automatically isolating the faulty converter 110A-110D. The controller 150 opens the main AC breaker 125, the respective AC circuit breaker 120A-120D, and DC circuit breaker 104A-104D to isolate the faulty converter 110A-110D from the operation. The controller 150 tags the AC and DC circuit breakers 104A-104D, 120A-120D, and the inter bridge 105 contactors, and disables the pulse release to isolate the faulty converter 110A-110D. After the fault has been rectified, a special reset 162 as shown in FIG. 4, is operated to release the isolated faulty converter 110A-110D back into operation.

According to another embodiment, the controller 150 monitors the currents produced at the converters 110A-110D independently. The controller 150 is configured to issue a warning if one of the converters 110A-110D is operating outside specified limits. Specifically, the controller 150 compares the actual currents with estimated current to be produced by an individual converter 110A-110D. Based on this comparison, the controller 150 issues a warning notification if the current of a particular converter 110A-110D is outside the specified limits. In addition monitoring the currents, the modularity control also performs switch (e.g., IGBT) firing mismatch monitoring in order to isolate the particular power stack in which the IGBT malfunctioning. By monitoring the currents and performing switch firing mismatch monitoring, the controller 150 is able to detect any issues with a particular converter or power stack in early stage without much damage to the stack or other healthy power stacks.

For example, in FIG. 1, all of the converters 110A-110D supply approximately 25% of the power to the load 50. If one of the converters 110A-110D is supply less than or more than 25% of the power, that is an indication to the controller 150 that one or more of the converters 110A-110D is not operated properly. The controller 150 further monitors the switching operation of the semiconductor device 112 of each converter 110A-110D and the PIBs 130A-130D. A warning notification is issued if a malfunction is detected to safely shut down the solar inverter 100. The controller 150 can be further configured to issue status notifications and warnings to the end user at the remote computing device 200. In this manner, the end user can determine when components need to be replaced and is notified of the overall health of the solar inverter 100.

The warning notifications allow the end user at the remote computing device 200 (as depicted in FIGS. 2A and 2B) to plan for maintenance and eliminate issues before damaging the solar inverter 100. Further, the end user can replace the particular module or gate card to avoid damage to the entire converter 110A-110D or the remaining converters 110A-110D.

According to yet another embodiment, the controller 150 is configured to perform a cyclic start operation of the converters 110A-110D to normalize the operation of the components (e.g., the AC and DC circuit breakers 104A-104D and 120A-120D) and maintain the same life cycle thereof. The controller 150 may perform a control operation to operate a single converter 110A-110D at startup of the solar inverter 100. If sufficient energy is available at the respective PV array 102A-102D, the running converter 110A-110D can be switched off and the solar inverter 100 restarted with all of the converters 110A-110D in operation. The controller 150 can further vary the specific converter 110A-110D used at start up to maintain the life cycle of each converter 110A-110D components especially AC and DC circuit breakers 104A-104D and 120A-120D.

For example, the controller 150 can activate a different converter 110A-110D on different days to normalize operation of the circuit breakers. As a result, the replacement of the first circuit breaker for the solar inverter 100 will occur later, increasing reliability of the solar inverter 100.

The controller 150 is also configured to detect faulty PV arrays 102A-102D and isolate the PV Array 102A-102D and corresponding converter 110A-110D by opening the corresponding DC circuit breakers 104A-104D and AC circuit breakers 120A-120D.

The present invention provides the advantages of increasing the inverter availability, thereby increasing the energy generated by the inverter; producing partial power with remaining healthy converters to maintain some power to the utility grid, early fault detection, and isolating of faulty PV arrays and other components associated with the converters to maintain the overall health of the inverter.

This written description uses examples to disclose the invention including the best mode, and also to enable any person skilled in the art to practice the invention, including making and using any devices or apparatuses and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An inverter comprising:
   a plurality of DC power sources configured to supply DC power,
   a plurality of converters to convert direct current power to alternating current power to be supplied to a load or a utility grid, and
   a controller configured to:
     (i) perform automatic modularity control of the plurality of converters, by separately controlling the plurality of converters and detecting an operation status thereof; and
     (ii) perform fault detection at the plurality of converters and isolate a respective converter of the plurality of converters, while continuously supplying power to the load via remaining healthy converters of the plurality of converters.

2. The inverter of claim 1, wherein the plurality of DC power sources comprise a plurality of photovoltaic arrays.

3. The inverter of claim 1, further comprising:
   a plurality of direct current circuit breakers each connected between a respective DC power source and an input of a converter of the plurality of converters, and
   a plurality of alternating current circuit breakers each connected between a respective DC power source and an output of a converter of the plurality of converters along with inter bridge contactors and fuses.

4. The inverter of claim 3, further comprising a line filter connected between each converter of the plurality of converters and a respective alternating current circuit breaker, and configured to remove harmonics from the alternating current power at the output of the converter.

5. The inverter of claim 1, wherein each converter of the plurality of converters comprises:
   a semiconductor device configured to perform a switching operation;
   a plurality of resistors and a plurality of capacitors formed in series, and connected in parallel with the semiconductor device.

6. The inverter of claim 4, further comprising a plurality of voltage/current sensors disposed at the input and output of each converter of the plurality of converters and configured to monitor the voltage/current at the input and output of each converter of the plurality of converters.

7. The inverter of claim 6, further comprising a main alternating current system circuit breaker connected with the plurality of alternating circuit breakers and configured to supply the alternating current power directly to the load or the utility grid.

8. The inverter of claim 7, further comprising a plurality of power interface boards, each corresponding to a respective converter of the plurality of converters, and connected together to interface between the plurality of converters and the controller for controlling operation and monitoring the status of each converter, the plurality of power interface boards, each configured to supply control signals from the controller to plurality of converters.

9. The inverter of claim 8, wherein the controller comprises:
   a programmable pulse generator configured to generate a pulse to control operation of each converter of the plurality of converters,
   a dual core central processing unit configured to perform control operations of the plurality of converters,
   a plurality of control modules, each configured to perform line current and voltage measurements, wherein the plurality of control modules are connected to the plurality of current/voltage sensors via power interface boards and then through ports of the controller using power interface board communication.

10. The inverter of claim 9, wherein the controller is further configured to:
    (i) continuously monitor the operation status of the plurality of converters, the DC power sources, and the power interface boards, for fault detection,
    (ii) perform the automatic modularity control by monitoring, tracking and storing faults detected.

11. The inverter of claim 10, wherein when a fault is detected, the controller is configured to:
    switch off the plurality of converters to isolate a faulty converter of the plurality of converters and reconfigure a power rating of the inverter and restart the inverter with power from remaining converters of the plurality of converters.

12. The inverter of claim 10, wherein when a fault is detected, the controller is configured to:
    isolate a faulty converter of the plurality of converters while simultaneously continuously supplying power to the inverter via remaining converters of the plurality of inverters.

13. The inverter of claim 10, wherein the controller is further configured to store the faults detected prior to automatically isolating the faulty converter of the plurality of converters.

14. The inverter of claim 10, wherein when a fault is detected, the controller is further configured to open the main alternating current circuit breaker, the direct current circuit breakers and the alternating current circuit breakers and disable a pulse release from the programmable pulse generator, to thereby isolate the faulty converter of the plurality of converters.

15. The inverter of claim 10, wherein the controller is further configured to issue a warning notification if one of the plurality of converters is operating outside of specified limit, by comparing actual current from the plurality of converters with an estimated current to be produced by an individual converter.

16. The inverter of claim 15, wherein the controller is further configured to monitor an operation status of the semiconductor device of each converter, the plurality of DC sources, and the power interface boards, and issue a warning notification if malfunction thereof is detected.

17. The inverter of claim 16, wherein the controller is further configured to perform a cyclic start operation of the plurality of converters comprising:
    (i) operating a specific converter of the plurality of converters at an initial startup operation of the inverter and when sufficient energy is available at a respective DC source, (ii) switching the plurality of converters off and restarting the inverter with a total of the plurality of converters.

18. The inverter of claim 17, wherein the controller is further configured to selectively vary the specific converter of the plurality of converters to be operated at the initial startup operation.

19. A method of performing automatic modularity control of an inverter having a plurality of converters and a controller, the method comprising:
   supplying DC power from a plurality of DC power sources to the plurality of converters to convert direct current power to alternating current power to be supplied to a load, and
   performing, via the controller, the automatic modularity control of the plurality of converters, by separately controlling the plurality of converters and detecting an operation status thereof; and
   performing, via the controller, fault detection at the plurality of converters and isolating a respective converter of the plurality of converters, while continuously supplying power to the load via remaining healthy converters of the plurality of converters.

20. The method of claim 19, further comprising:
   connecting a plurality of direct current circuit breakers between a respective DC power source and an input of a converter of the plurality of converters, and connecting a plurality of alternating current circuit breakers between a respective DC power source along with inter bridge contactors, fuses, and an output of a converter of the plurality of converters, and
   connecting a main alternating current circuit breaker with the plurality of alternating circuit breakers and supplying the alternating current power directly to the load via the main alternating current circuit breaker.

21. The method of claim 20, further comprising:
   monitoring voltage/current at the input and output of each converter of the plurality of converters, via a plurality of voltage/current sensors in communication with the controller.

22. The method of claim 21, further comprising:
   interfacing, via a plurality of power interface boards, each corresponding to a respective converter of the plurality of converters, with the controller for controlling operation and monitoring the status of each converter.

23. The method of claim 21, further comprising:
   generating, via a programmable pulse generator, a pulse to control operation of each converter of the plurality of converters.

24. The method of claim 23, further comprising:
   continuously monitoring, via the controller, the operation status of the plurality of converters, the DC power sources, and the power interface boards, for fault detection,
   performing the automatic modularity control by monitoring, tracking and storing faults detected.

25. The method of claim 24, wherein when a fault is detected, switching off, via the controller, the plurality of converters to isolate a faulty converter of the plurality of converters and reconfiguring a power rating of the inverter and restarting the inverter with power from remaining converters of the plurality of converters.

26. The method of claim 24, wherein when a fault is detected, opening the main alternating current circuit breaker, the direct current circuit breakers and the alternating current circuit breakers and disabling a pulse release from the programmable pulse generator, to thereby isolate the faulty converter of the plurality of converters.

27. The method of claim 26, further comprising:
   issuing, via the controller, a warning notification if one of the plurality of converters is operating outside of specified limit, by comparing actual current from the plurality of converters with an estimated current to be produced by an individual converter.

28. The method of claim 27, further comprising:
   monitoring, via the controller, an operation status of the semiconductor device of each converter, the plurality of DC sources, and the power interface boards, and issuing a warning notification if malfunction thereof is detected.

29. The method of claim 28, further comprising:
   performing a cyclic start operation of the plurality of converters, via the controller, comprising:
   (i) operating a specific converter of the plurality of converters at an initial startup operation of the inverter and when sufficient energy is available at a respective DC source,
   (ii) switching the plurality of converters off and restarting the inverter with a total of the plurality of converters.

30. The method of claim 29, wherein performing a cyclic start operation further comprises:
   selectively varying the specific converter of the plurality of converters to be operated at the initial startup operation.

\* \* \* \* \*